United States Patent
Lee et al.

(10) Patent No.: US 8,901,533 B2
(45) Date of Patent: Dec. 2, 2014

(54) SEMICONDUCTOR DEVICES AND METHODS OF MANUFACTURING THE SAME

(71) Applicant: Samsung Electronics Co., Ltd., Suwon-Si, Gyeonggi-Do (KR)

(72) Inventors: Sang-moon Lee, Yongin-si (KR); Young-jin Cho, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/789,873

(22) Filed: Mar. 8, 2013

(65) Prior Publication Data

US 2013/0341595 A1  Dec. 26, 2013

(30) Foreign Application Priority Data

Jun. 22, 2012  (KR) .................. 10-2012-0067302

(51) Int. Cl.

| | | |
|---|---|---|
| *H01L 29/12* | (2006.01) | |
| *H01L 31/0336* | (2006.01) | |
| *H01L 31/072* | (2012.01) | |
| *H01L 21/00* | (2006.01) | |
| *H01L 21/337* | (2006.01) | |
| *H01L 29/778* | (2006.01) | |
| *H01L 29/10* | (2006.01) | |
| *H01L 29/15* | (2006.01) | |
| *H01L 29/66* | (2006.01) | |
| H01L 29/51 | (2006.01) | |
| H01L 29/06 | (2006.01) | |

(52) U.S. Cl.
CPC ............ *H01L 29/15* (2013.01); *H01L 29/7781* (2013.01); *H01L 29/517* (2013.01); *H01L 29/1075* (2013.01); *H01L 29/7783* (2013.01); *H01L 29/66462* (2013.01); *H01L 29/0657* (2013.01)
USPC ............... 257/11; 257/24; 257/189; 257/213; 438/93; 438/94; 438/191

(58) Field of Classification Search
USPC ........... 438/93, 94, 191; 257/11, 24, 189, 213
See application file for complete search history.

(56) References Cited

U.S. PATENT DOCUMENTS 7,977,706 B2    7/2011  Lochtefeld
8,253,220 B2 *  8/2012  Kajitani et al. ............... 257/609
(Continued)

FOREIGN PATENT DOCUMENTS

| KR | 20000019563 A | 4/2000 |
|---|---|---|
| KR | 20010008658 A | 2/2001 |
| KR | 20010056977 A | 7/2001 |

(Continued)

OTHER PUBLICATIONS

G. Wang, et al., "Selective Area Growth of High Quality InP on Si (001) Substrates", Applied Physics Letters 97, 121913, 2010.

*Primary Examiner* — Hsien Ming Lee
(74) *Attorney, Agent, or Firm* — Harness, Dickey & Pierce, P.L.C.

(57) ABSTRACT

Semiconductor devices including a substrate (e.g., silicon substrate), a multi-layer structure disposed on a portion of the substrate, and at least one electrode disposed on the multi-layer structure and methods of manufacturing the same are provided. The multi-layer structure may include an active layer containing a Group III-V material and a current blocking layer disposed between the substrate and the active layer. The semiconductor device may further include a buffer layer disposed between the substrate and the active layer. In a case that the substrate is a p-type, the buffer layer may be an n-type material layer and the current blocking layer may be a p-type material layer. The current blocking layer may contain a Group III-V material. A mask layer having an opening may be disposed on the substrate so that the multi-layer structure may be disposed on the portion of the substrate exposed by the opening.

36 Claims, 9 Drawing Sheets

(56) References Cited

U.S. PATENT DOCUMENTS

| | | |
|---|---|---|
| 2007/0297475 A1* | 12/2007 | Sasada et al. ............. 372/44.01 |
| 2010/0072515 A1 | 3/2010 | Park et al. |
| 2011/0193058 A1* | 8/2011 | Moon et al. .................... 257/13 |
| 2012/0033409 A1* | 2/2012 | Jeong et al. .................. 362/97.1 |

FOREIGN PATENT DOCUMENTS

| | | |
|---|---|---|
| KR | 20060084470 A | 7/2006 |

\* cited by examiner

SEMICONDUCTOR DEVICES AND METHODS OF MANUFACTURING THE SAME

CROSS-REFERENCE TO RELATED APPLICATIONS

This application claims the benefit of Korean Patent Application No. 10-2012-0067302, filed on Jun. 22, 2012, in the Korean Intellectual Property Office, the disclosure of which is incorporated herein in its entirety by reference.

BACKGROUND

1. Field

The present disclosure relates to semiconductor devices and methods of manufacturing the same, and more particularly, to semiconductor devices including Group III-V semiconductors and methods of manufacturing the same.

2. Description of the Related Art

Silicon (Si)-based semiconductor devices have been developed to have higher integration density and higher performance. However, due to limitations in material properties of Si and manufacturing processes, it may become difficult to further improve performance and integration degree of Si-based semiconductor devices in the near future.

To overcome limitations of Si-based semiconductor devices, research is being made into semiconductor devices using Group III-V materials (semiconductors). Furthermore, research is also being made into integration of a Si-based semiconductor device and a semiconductor device including a Group III-V material into a single device and fabrication of highly-efficient optical device (e.g., a solar cell) including a Group III-V materials on a Si substrate.

However, because there are significant differences between lattice constants and thermal expansion coefficients of a Group III-V material and Si, and surface polarity of the Group III-V material also differs from that of Si, many defects may be formed at an interface between the Group III-V material and Si. Furthermore, it may be difficult to control electrical characteristics between a Group III-V material and Si. Therefore, application of a Group III-V material to a Si substrate or a Si-based device may be limited.

SUMMARY

Provided are semiconductor devices with reduced growth defects and excellent electrical characteristics.

Provided are semiconductor devices with reduced leakage current and excellent operating characteristics.

Provided are semiconductor devices in which a current blocking layer is interposed between a substrate and an active layer.

Provided are semiconductor devices in which a Group III-V material is applied onto a silicon substrate.

Provided are semiconductor devices including a Group III-V material that is formed via a selective area growth (SAG) process.

Provided are methods of manufacturing the semiconductor devices as described above.

Additional aspects will be set forth in part in the description which follows and, in part, will be apparent from the description, or may be learned by practice of the presented embodiments.

According to an example embodiment, a semiconductor device includes a substrate, a multi-layer structure disposed on a portion of the substrate, and at least one electrode disposed on the multi-layer structure, wherein the multi-layer structure includes an active layer containing a Group III-V material; and a current blocking layer between the substrate and the active layer.

The substrate may be a silicon substrate.

The multi-layer structure may further include a buffer layer disposed between the substrate and the current blocking layer.

The buffer layer may include a Group III-V material.

The buffer layer may be an n-type material layer.

The multi-layer structure may further include a barrier layer disposed between the current blocking layer and the active layer.

An energy band gap of the barrier layer may be larger than that of the active layer.

The active layer may have a quantum well structure.

The active layer may contain at least one of InGaAs, InP, InSb, and InAs, as the Group III-V material.

The current blocking layer may include a Group III-V material.

The Group III-V material of the current blocking layer may be a binary material, a ternary material, or a quaternary material which include at least one of a group consisting of In, Ga, and Al and at least one of a group consisting of As, P, and Sb.

At least a portion of the current blocking layer may be doped with a p-type impurity.

The current blocking layer may have a single-layer structure or a multi-layer structure, including a p-type material layer.

If the current blocking layer has the multi-layer structure, the current blocking layer may include a p-type first layer, an n-type second layer, and a p-type third layer wherein the n-type second layer and the p-type third layer are alternately stacked on the p-type first layer for one or more times.

A mask layer may be disposed on the substrate. The mask layer may include an opening exposing a portion of the substrate, and the multi-layer structure may be disposed on the portion of the substrate exposed by the opening.

The substrate may include a recessed region which is formed in the substrate and exposed by the opening, and the multi-layer structure may be disposed at least partially in the recessed region.

The semiconductor device may be a transistor. In this case, the active layer may be a channel layer.

The at least one electrode may include a source electrode disposed on a first region of the active layer; a drain electrode disposed on a second region of the active layer; and a gate electrode disposed on a portion of the active layer between the source electrode and the drain electrode.

According to an example embodiment, a transistor includes a silicon substrate, a mask layer arranged on the silicon substrate, the mask layer including an opening exposing a portion of the silicon substrate, a multi-layer structure on the portion of the substrate exposed by the opening, the multi-layer structure including a buffer layer, a current blocking layer, and a channel layer that are arranged in the order stated, a source electrode electrically connected to a first region of the channel layer, a drain electrode electrically connected to a second region of the channel layer, and a gate electrode arranged on a third region of the channel layer.

The silicon substrate may include a recessed region formed in the substrate and exposed by the opening, and at least one of the buffer layer, the current blocking layer, and the channel layer may be at least partially disposed in the recessed region.

At least one of the buffer layer, the current blocking layer, and the channel layer may include a Group III-V material.

The buffer layer may be an n-type material layer.

The current blocking layer may have a single-layer structure or a multi-layer structure, including a p-type material layer.

The current blocking layer may include a Group III-V material, the Group III-V material is a binary material, a ternary material, or a quaternary material which include at least one of a group consisting of In, Ga, and Al and at least one of a group consisting of As, P, and Sb.

The transistor may further include a barrier layer arranged between the current blocking layer and the channel layer.

An energy band gap of the barrier layer may be larger than that of the channel layer.

The buffer layer may include an n-InP layer, the current blocking layer may include a p-InP layer, the barrier layer may include an InAlAs layer, and the channel layer may include an InGaAs layer.

According to an example embodiment, a method of manufacturing a semiconductor device, the method includes forming a multi-layer structure on a portion of a substrate, and forming at least one electrode on the multi-layer structure, wherein the forming of the multi-layer structure includes forming a current blocking layer on the portion of the substrate, and forming an active layer containing a Group III-V material on the current blocking layer.

The substrate may be a silicon substrate.

The multi-layer structure may be formed via a selective area growth (SAG) method.

The method may further include, before the forming a multi-layer structure, forming a mask layer on the substrate, the mask layer including an opening exposing the portion of the substrate such that the multi-layer structure may be formed on the portion of the substrate exposed by the opening.

The method may further include, after the forming a mask layer, forming a recessed region by etching the portion of the substrate exposed by the opening, wherein the multi-layer structure may be formed at least partially in the recessed region.

The forming a multi-layer structure may further include forming a buffer layer between the substrate and the current blocking layer.

The buffer layer may contain a Group III-V material doped with an n-type impurity.

The forming a multi-layer structure may further include forming a barrier layer between the current blocking layer and the active layer.

An energy band gap of the barrier layer may be larger than that of the channel layer.

The active layer may contain at least one of InGaAs, InP, InSb, and InAs, as the Group III-V material.

The current blocking layer may contain a Group III-V material.

The Group III-V material of the current blocking layer may be a binary material, a ternary material, or a quaternary material which include at least one of a group consisting of In, Ga, and Al and at least one of a group consisting of As, P, and Sb.

The current blocking layer may have a single-layer structure or a multi-layer structure, and the current blocking layer may include a p-type material layer.

The semiconductor device may be a transistor.

The forming at least one electrode may include forming a source electrode on a first region of the active layer, forming a drain electrode on a second region of the active layer, and forming a gate electrode on a portion of the active layer between the source electrode and the drain electrode.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Semiconductor devices and/or methods of manufacturing the same according to embodiments of the present invention will now be described more fully with reference to the accompanying drawings, in which exemplary embodiments of the invention are shown. In the drawings, the thicknesses of layers and regions are exaggerated for clarity. Like reference numerals in the drawings denote like elements throughout the detailed description of the invention.

Figure 1:
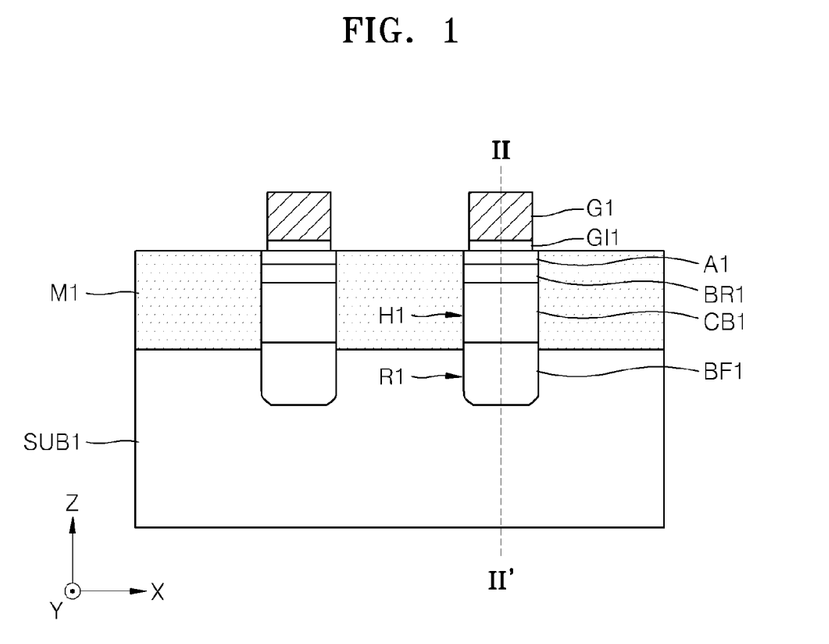
FIG. 1 is a sectional view of a semiconductor device according to an example embodiment.
Figure 2:
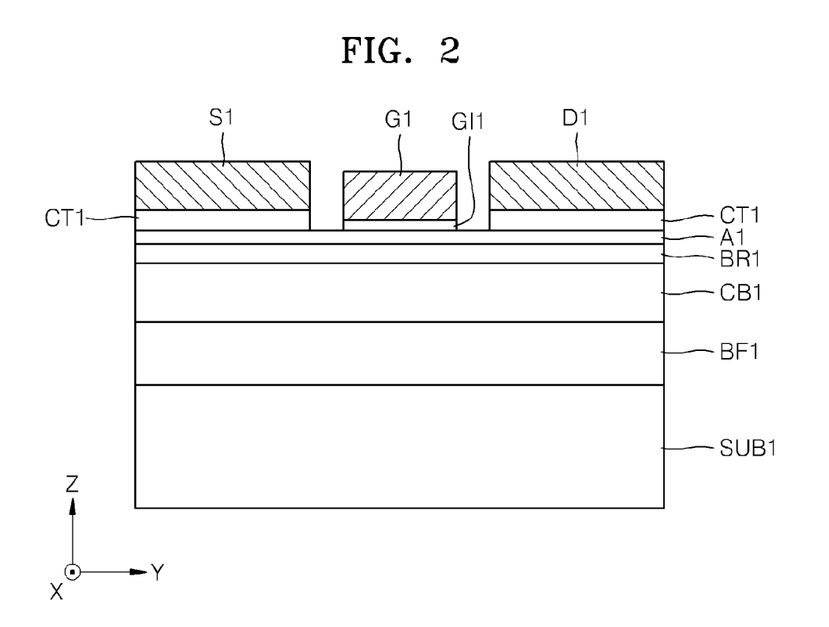
FIG. 2 is a sectional view taken along a line II-II' of FIG. 1.

FIG. 1 is a sectional view of a semiconductor device according to an embodiment. FIG. 2 is a sectional view taken along a line II-II' of FIG. 1.

Referring to FIG. 1, a mask layer M1 may be disposed (arranged) on a substrate SUB1. The substrate SUB1 may be a monocrystalline substrate formed of a single element. For example, the substrate SUB1 may be a silicon (Si) substrate. Furthermore, the substrate SUB1 may be doped with a p-type impurity. Therefore, the substrate SUB1 may be a p-type Si substrate (p-Si substrate). The mask layer M1 may be formed of an insulation material, such as a silicon oxide or a silicon nitride. The mask layer M1 may have a single-layer structure or a multi-layer structure, including at least one of a silicon oxide and a silicon nitride. At least one groove H1 may be formed into the mask layer M1. The groove H1 may be formed into the substrate SUB1. In other words, a portion of the substrate SUB1 at the groove H1 may be etched (recessed). The etched (recessed) portion of the substrate SUB1 may be referred to as a recessed region R1. The recessed region R1 may be considered as a lower portion of the groove H1. The groove H1 may define one 'device region.' A width of the groove H1 in the x-axis direction may be from several nanometers to several hundreds of nanometers (nm), e.g., from about 10 nm to about 500 nm.

A buffer layer BF1 may be disposed on the substrate SUB1 in the groove H1, e.g., on the substrate SUB1 at the recessed region R1, and a current blocking layer CB1 and an active layer A1 may be disposed on the buffer layer BF1 in the order stated. Therefore, the current blocking layer CB1 may be arranged between the substrate SUB1 and the active layer A1, and more particularly, between the buffer layer BF1 and the active layer A1. A barrier layer BR1 may be further disposed between the current blocking layer CB1 and the active layer A1. It may be considered that the buffer layer BF1, the current blocking layer CB1, the barrier layer BR1, and the active layer A1 constitute a multi-layer structure or a stacked structure. At least one of the buffer layer BF1, the current blocking layer CB1, the barrier layer BR1, and the active layer A1 may include a Group III-V based material. All of the buffer layer BF1, the current blocking layer CB1, the barrier layer BR1, and the active layer A1 may be formed of Group III-V based materials. The buffer layer BF1, the current blocking layer CB1, the barrier layer BR1, and the active layer A1 may be layers formed from the substrate SUB1 via epitaxial growths. In a case where the Group III-V material layers (e.g., the buffer layer BF1, the current blocking layer CB1, the barrier layer BR1, and the active layer A1) are selectively formed in the narrow groove H1 defined by the mask layer M1, defects are trapped on the sidewalls of the groove H1, and thus crystallinity of the Group III-V material layers may be improved as closer to the upper portion thereof. Therefore, in the present embodiment, the active layer A1 may have excellent crystallinity.

The buffer layer BF1 may be formed of a Group III-V material containing at least one of a group consisting of In, Ga, and Al and at least one of a group consisting of As, P, and Sb. The Group III-V material of the buffer layer BF1 may be a binary material, a ternary material, or a quaternary material. The binary material may include InP, InAs, InSb, GaAs, GaP, GaSb, AlP, AlAs, or AlSb, for example. The ternary material may include InAlAs, InGaP, or GaAsP, for example. The quaternary material may be InGaAsP or InGaAlAs, for example. The buffer layer BF1 may be an n-type material layer. The buffer layer BF1 may be a layer doped with an n-type impurity or may have characteristics similar to those of an n-doped layer. For example, the buffer layer BF1 may be an n-type InP layer (n-InP layer). The buffer layer BF1 may be provided to reduce differences between lattice constants and thermal expansion coefficients of the substrate SUB1 and the active layer A1 and reduce defects therebetween, thereby improving crystallinity of the active layer A1. Particularly, in a case where the buffer layer BF1 is formed in the groove H1 having a smaller width, defects are trapped on the sidewalls of the groove H1 as the buffer layer BF1 is formed, and thus the current blocking layer CB1 formed on the buffer layer BF1 may have less defects. The active layer A1 formed on the current blocking layer CB1 may have little defects. As a result, the active layer A1 with excellent crystallinity may be obtained.

The current blocking layer CB1 may include a material (Group III-V material) similar to the material of the buffer layer BF1. More particularly, the current blocking layer CB1 may be formed of a Group III-V material containing at least one of a group consisting of In, Ga, and Al and at least one of a group consisting of As, P, and Sb.

The Group III-V material of the current blocking layer CB1 may be a binary material, a ternary material, or a quaternary material. The binary material may include InP, InAs, InSb, GaAs, GaP, GaSb, AlP, AlAs, or AlSb, for example. The ternary material may include InAlAs, InGaP, or GaAsP, for example. The quaternary material may be InGaAsP or InGaAlAs, for example. At least a portion of the current blocking layer CB1 may be a p-type material layer. In other words, at least a portion of the current blocking layer CB1 may be doped with a p-type impurity. In the present embodiment, the current blocking layer CB1 may be a p-type layer entirely doped with a p-type impurity. The p-type impurity may be Zn, Mg, or C, for example, and doping concentration of the p-type impurity may be from about $1 \times 10^{18}/cm^3$ to about $3 \times 10^{18}/cm^3$. For example, the current blocking layer CB1 may be a p-type InP layer (p-InP layer). Because the current blocking layer CB1 has a conductive type opposite to that of the buffer layer BF1, a pn junction may be formed therebetween, and thus flow of a current from the upper portion above the current blocking layer CB1 to the buffer layer BF1 may be blocked (or suppressed). Furthermore, at least a portion (at least the lower portion) of the current blocking layer CB1 may function similarly as the buffer layer BF1. In other words, at least a portion (at least the bottom portion) of the current blocking layer CB1 may function to reduce defects, like the buffer layer BF1.

The active layer A1 may include a Group III-V material (semiconductor). The active layer A1 may include at least one of InGaAs, InP, InSb, and InAs as the Group III-V material, for example. Furthermore, the active layer A1 may have a quantum well structure. The active layer A1 may be used as a channel layer. In this case, the active layer A1 may be a quantum well channel layer.

The barrier layer BR1 may be further arranged between the active layer A1 and the current blocking layer CB1. The barrier layer BR1 may include a material having a greater energy band gap as compared to the active layer A1. Furthermore, the lowest energy level Ec of a conduction band of the barrier layer BR1 may be higher than that of the active layer A1. Due to the barrier layer BR1, the active layer A1 may have the quantum well structure as described above. The barrier layer BR1 may include a Group III-V material. For example, the barrier layer BR1 may be formed of a Group III-V material containing at least one of a group consisting of In, Ga, and Al and at least one of a group consisting of As, P, and Sb. For example, the barrier layer BR1 may be formed of InAlAs, InP or the like.

Depth of the groove H1 including the recessed region R1, e.g., a distance between the bottom surface of the recessed region R1 to the top surface of the mask layer M1 may be from about several hundreds of nm to about several μm, for example. If the depth of the groove H1 is referred to as the depth d1, thickness of the buffer layer BF1 may be from about 5% to about 40% of the depth d1, thickness of the current blocking layer CB1 may be from about 5% to about 40% of the depth d1, and thickness of the barrier layer BR1 may be from about 5% to about 40% of the depth d1. The thickness of the barrier layer BR1 may be smaller than the thickness of the buffer layer BF1 and the thickness of the current blocking layer CB1. Thickness of the active layer A1 may be about 100 nm or less, e.g., about 50 nm or less. Although FIG. 1 shows that all of the buffer layer BF1, the current blocking layer CB1, the barrier layer BR1, and the active layer A1 are arranged in the groove H1, some of them may protrude above the groove H1. For example, at least a portion of the active layer A1, at least a portion of the barrier layer BR1 and the active layer A1, or at least a portion of the current blocking layer CB1, the barrier layer BR1 and the active layer A1 may protrude above the groove H1.

At least one electrode may be disposed on the active layer A1. FIG. 1 shows a case in which a gate electrode G1 is disposed on the active layer A1. In this case, a gate insulation layer GI1 may be disposed between the active layer A1 and the gate electrode G1. Although not shown in FIG. 1, a source electrode and a drain electrode may be disposed at both sides of the gate electrode G1 in the y-axis direction. The source electrode and the drain electrode may be seen in FIG. 2, which is a sectional view taken along a line II-II' of FIG. 1.

Referring to FIG. 2, a source electrode S1 and a drain electrode D1 may be disposed on the active layer A1 at both side of the gate electrode G1. An ohmic contact layer CT1 may be further disposed between the source electrode S1 and the active layer A1 and between the drain electrode D1 and the active layer A1. The ohmic contact layer CT1 may include a Group III-V material with low resistance. For example, the ohmic contact layer CT1 may be formed of InGaAs heavily doped with an n-type impurity (n+ InGaAs). However, the n+InGaAs constituting the ohmic contact layer CT1) is merely an example, and the ohmic contact layer CT1 may be formed of various materials. The gate electrode G1, the source electrode S1, and the drain electrode D1 may be formed of various metals or conductive oxides. The gate electrode G1 and the source/drain electrodes S1 and D1 may be formed of a same material or may be formed of different materials. Meanwhile, the gate insulation layer GI1 may include at least one from among $Al_2O_3$, $SiO_x$, $Si_xN_y$, $Sc_2O_3$, AlN, $Ga_2O_3$, $Gd_2O_3$, $Al_xGa_{2(1-x)}O_3$, MgO, and combinations thereof. Even if not stated above, any of gate insulation layer materials used in general transistors may be applied to the gate insulation layer GI1. Because the gate insulation layer GI1 has a very large energy band gap, the gate insulation layer GI1 may function like a 'barrier layer' with respect to the active layer A1. In other words, the gate insulation layer GI1 may also function as a second barrier layer. In this case, the active layer A1 may be regarded as disposed between two barrier layers, e.g., the lower barrier layer BR1 and an upper barrier layer (e.g., the gate insulation layer GI1).

Although not shown in FIGS. 1 and 2, if necessary, a separate second barrier layer may be disposed on the active layer A1. In this case, the second barrier layer may be arranged between the active layer A1 and the gate insulation layer GI1. The second barrier layer may be formed of the same material as the barrier layer BR1 or a material similar to the material constituting the barrier layer BR1.

In the present embodiment, because the current blocking layer CB1 is arranged between the substrate SUB1 and the active layer A1, leakage of current from the active layer A1 to the substrate SUB1 may be effectively suppressed (or prevented). If the current blocking layer CB1 is not provided, current may be easily leaked from the active layer A1 to the substrate SUB1 via the buffer layer BF1. In detail, when the buffer layer BF1 is formed, due to unintentional doping (UID) phenomenon, the buffer layer BF1 may be formed to have a high doping level (concentration) to about $1 \times 10^{17}/cm^3$ or to about $3 \times 10^{18}/cm^3$. As a result, the buffer layer BF1 may have relatively high electric conductivity. Therefore, if the current blocking layer CB1 is not arranged, current may be easily leaked from the active layer A1 to the substrate SUB1 via the buffer layer BF1. Particularly, large current may be leaked from the source electrode S1 toward the substrate SUB1. As a result, operation characteristics required in a semiconductor device, e.g., basic switching characteristics of a transistor, may be significantly deteriorated. However, as in the present embodiment, if the current blocking layer CB1 is arranged between the substrate SUB1 and the active layer A1, and more particularly, between the buffer layer BF1 and the active layer A1, a semiconductor device (e.g., a transistor) is capable of effectively suppressing (or preventing) leakage current and has excellent operation characteristics and reliability.

Furthermore, in the present embodiment, the buffer layer BF1, the current blocking layer CB1, and the active layer A1 are grown from a portion of the substrate SUB1 by using the mask layer M1 in which the groove H1 is formed. Thus, defects may be effectively reduced/prevented, and thus the active layer A1 with excellent crystallinity may be obtained. Accordingly, characteristics of a semiconductor device employing the active layer A1 as one of major components may be improved. If a Group III-V material layer is formed on an entire surface of a Si substrate without using the mask layer M1, a large number of defects are formed in the Group III-V material layer due to differences between lattice constants and thermal expansion coefficients of the Si substrate and the Group III-V material, and it is difficult to suppress growth and progress of the defects. Therefore, it is difficult to form a Group III-V material layer with excellent quality without using the mask layer M1. However, according to the present embodiment, when Group III-V material layers are formed from a limited portion of the substrate SUB1 by using the mask layer M1 having the groove H1, the inner sidewalls of the groove H1 traps defects, and thus the active layer A1 with excellent crystallinity may be obtained.

Although FIGS. 1 and 2 show a case in which the current blocking layer CB1 has a single layer structure, the current blocking layer CB1 may have a multi-layer structure according to another embodiment of the present invention. An example thereof is shown in FIG. 3.

Figure 3:
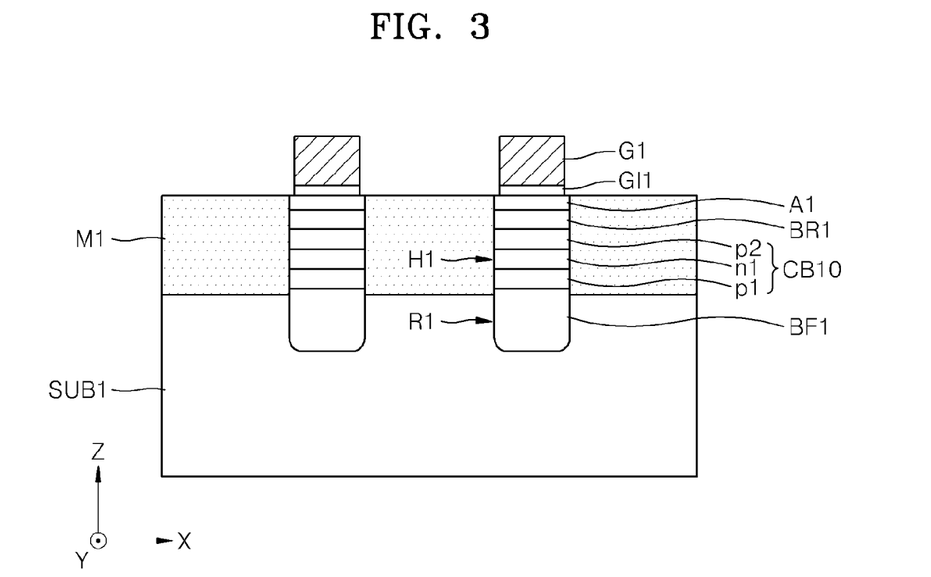
FIG. 3 is a sectional view of a semiconductor device according to an example embodiment.

Referring to FIG. 3, a current blocking layer CB10 may have a multi-layer structure including at least one p-type material layer p1 and p2 and at least one n-type material layer n1. For example, the current blocking layer CB10 may have a p/n/p multi-layer structure. In other words, the current blocking layer CB10 may have a structure in which the n-type material layer n1 is arranged between the two p-type material layers p1 and p2. Both the p-type material layers p1 and p2 and the n-type material layer n1 may contain Group III-V materials. Here, the Group III-V materials may be same as the Group III-V materials described above regarding the current blocking layer CB1 of FIG. 1. For example, a p-type impurity included in the p-type material layers p1 and p2 may be Zn, Mg, C, etc., whereas an n-type impurity included in the n-type material layer n1 may be Si, Se, Te, S, etc. Furthermore, the current blocking layer CB10 may have a structure in which an n-type second layer and a p-type third layer are alternately and repeatedly stacked at least twice on a p-type first layer. In other words, the current blocking layer CB10 may have a p/n/p/n/p structure or a p/n/p/n/p/n/p structure.

As shown in FIG. 3, even if the current blocking layer CB10 is formed to have a multi-layer structure, if the current blocking layer CB10 has the structure as described above (e.g., the p/n/p structure, the p/n/p/n/p structure, the p/n/p/n/p/n/p structure, etc.), current leakage from the active layer A1 to the substrate SUB1 may be effectively suppressed (or prevented) by the current blocking layer CB10.

Although FIGS. 1 through 3 show cases in which the recessed region R1 is formed at the portion of the substrate SUB1 corresponding to the groove H1 of the mask layer M1 and the buffer layer BF1, the current blocking layer CB1 or CB10, and the active layer A1 are disposed on the recessed region R1, the portion of the substrate SUB1 corresponding to the groove H1 may not be etched according to another embodiment. An example thereof is shown in FIG. 4.

Figure 4:
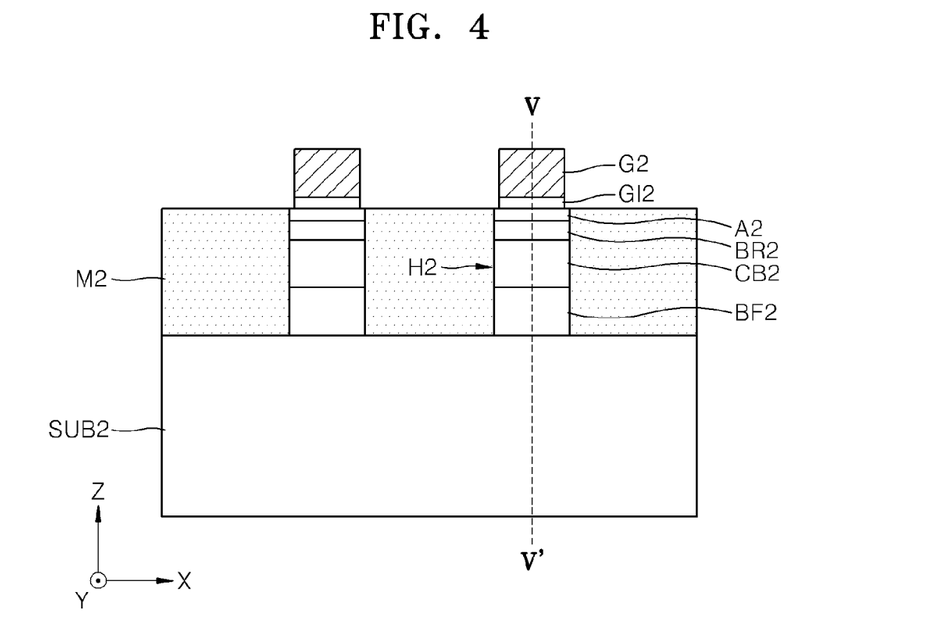
FIG. 4 is a sectional view of a semiconductor device according to an example embodiment of the present invention.

Referring to FIG. 4, the top surface of a substrate SUB2 may be overall flat, and a mask layer M2 having a groove H2 may be arranged thereon. The groove H2 may be an opening for exposing a portion of the substrate SUB2. A buffer layer BF2, a current blocking layer CB2, a barrier layer BR2, and an active layer A2 may be disposed in the order stated on the portion of the top surface of the substrate SUB2 exposed by the groove H2. Materials and properties of the buffer layer BF2, the current blocking layer CB2, the barrier layer BR2, and the active layer A2 may be same as or similar to those of the buffer layer BF1, the current blocking layer CB1, the barrier layer BR1, and the active layer A1 of FIG. 1, respectively. A gate insulation layer GI2 and a gate electrode G2 may be disposed on the active layer A2.

Figure 5:
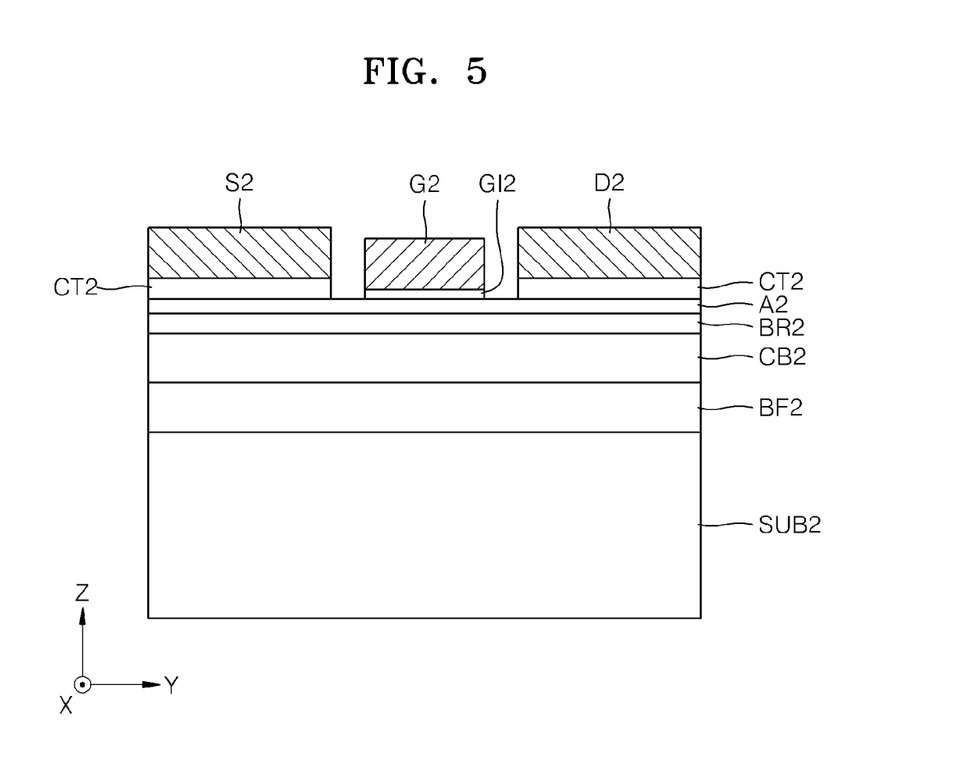
FIG. 5 is a sectional view taken along a line V-V of FIG. 4.

FIG. 5 is a sectional view taken along a line V-V' of FIG. 4. In FIG. 5, the reference numerals CT2, S2, and D2 denote an ohmic contact layer, a source electrode, and a drain electrode, respectively. The structure shown in FIG. 5 is similar to that shown in FIG. 2, and thus detailed description thereof will be omitted.

FIGS. 6A through 6F are sectional views showing a method of manufacturing a semiconductor device according to an example embodiment.

Figure 6A:
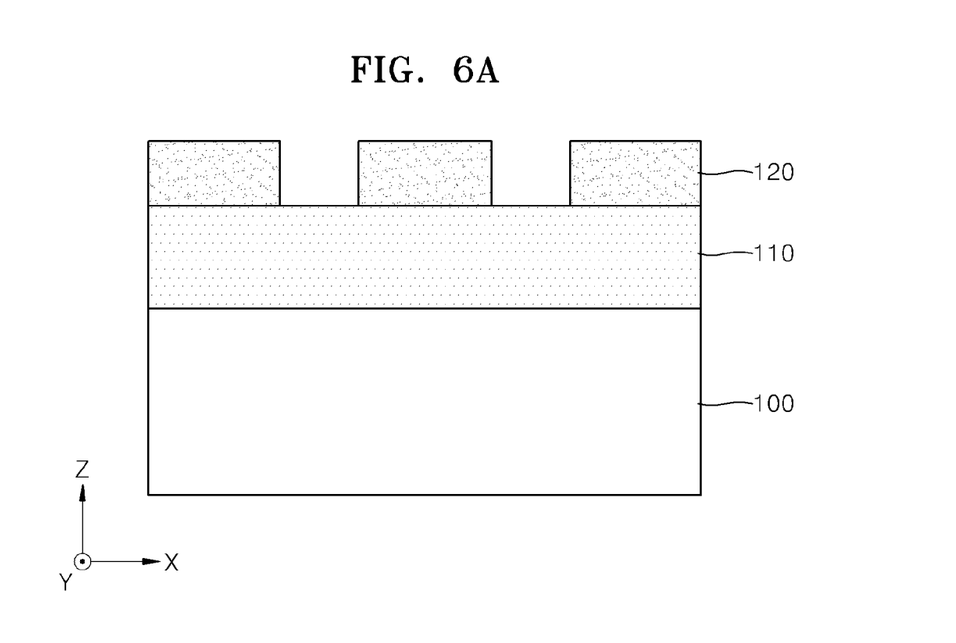
FIGS. 6A through 6F are sectional views showing a method of manufacturing a semiconductor device according to an example embodiment.

Referring to FIG. 6A, an insulation layer 110 may be formed on a substrate 100. The substrate 100 may be a monocrystalline substrate formed of a single element. For example, the substrate 100 may be a Si substrate. Furthermore, the substrate 100 may be doped with a p-type impurity. Therefore, the substrate 100 may be a p-type Si substrate (p-Si substrate). The insulation layer 110 may be formed of an insulation material, e.g., a silicon oxide or a silicon nitride. The insulation layer 110 may have a single-layer structure or a multi-layer structure, including at least one of a silicon oxide and a silicon nitride. A photosensitive film pattern 120 may be formed on the insulation layer 110. The photosensitive film pattern 120 may have at least one opening for exposing a portion of the insulation layer 110.

Figure 6B:
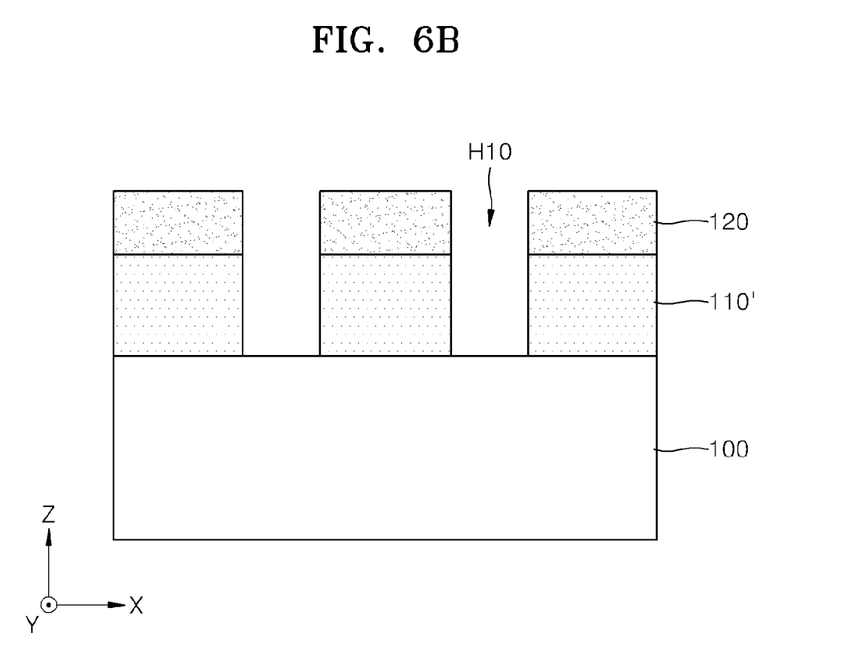

The insulation layer 110 may be etched (patterned) by using the photosensitive film pattern 120 as an etch barrier. As a result, as shown in FIG. 6B, an insulation layer pattern 110' having a groove H10 which exposes the substrate 100 may be formed. The insulation layer pattern 110' may be a hard mask for the substrate 100. Hereinafter, the insulation layer pattern 110' will be referred to as a mask layer 110'.

Figure 6C:
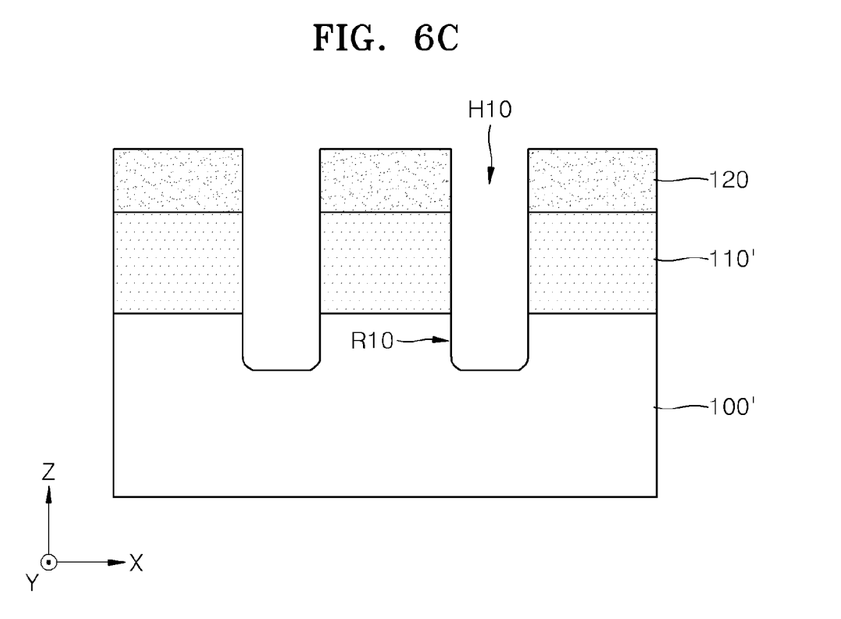

A portion of the substrate 100 may be etched (recessed) by using the mask layer 110' as an etch barrier. A result thereof is shown in FIG. 6C. Referring to FIG. 6C, a recessed region R10 is formed below the groove H10. The reference numeral 100' denotes a substrate having formed therein the recessed region R10. The recessed region R10 may be considered as a downward extension of the groove H10. In other words, a depth of the groove H10 may increase due to the recessed region R10. While the recessed region R10 is being formed by etching a portion of the substrate 100, at least a portion of the photosensitive film pattern 120 may be removed.

Figure 6D:
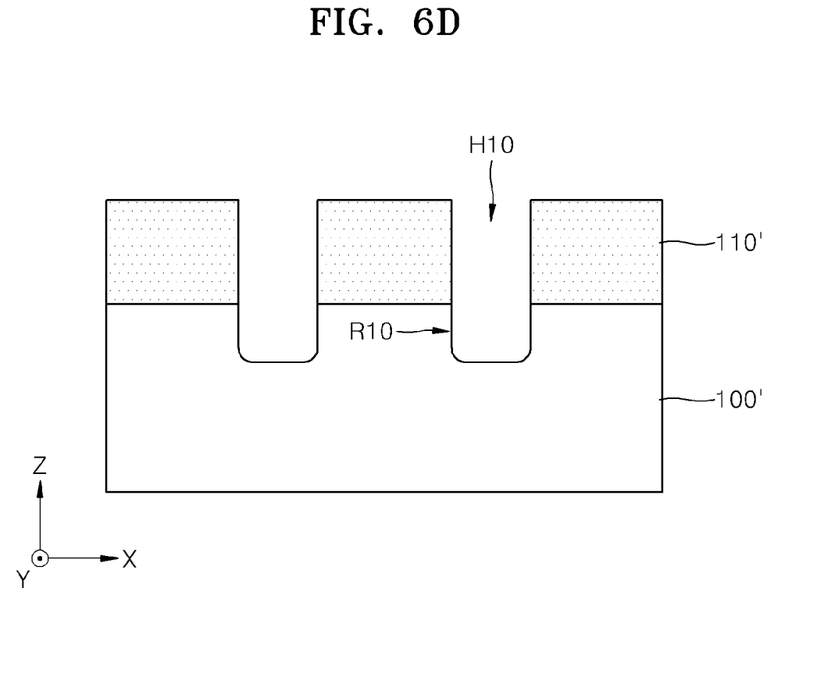

After the recessed region R10 is formed, if the photosensitive film pattern 120 remains on the mask layer 110', an operation for removing the remaining photosensitive film pattern 120 may be performed. The photosensitive film pattern 120 may be removed by an ashing process using oxygen plasma, for example. A result of removing the photosensitive film pattern 120 remaining on the mask layer 110' may be removed as shown in FIG. 6D.

Figure 6E:
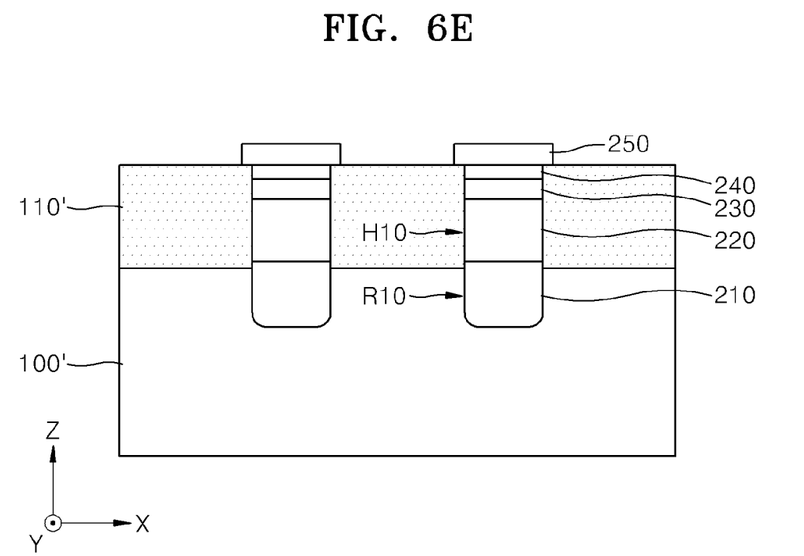

Referring to FIG. 6E, a buffer layer 210, a current blocking layer 220, and an active layer 240 may be formed in the order stated at the recessed region R10 of the substrate 100'. A barrier layer 230 may be further formed between the current blocking layer 220 and the active layer 240. At least one of the buffer layer 210, the current blocking layer 220, the barrier layer 230, and the active layer 240 may include a Group III-V based material. All of the buffer layer 210, the current blocking layer 220, the barrier layer 230, and the active layer 240 may be formed of Group III-V based materials. The buffer layer 210, the current blocking layer 220, the barrier layer 230, and the active layer 240 may be formed from the recessed region R10 of the substrate 100' via epitaxial growths. Because the above material layers 210, 220, 230, and 240 are selectively formed at a portion (e.g., the recessed region R10) of the substrate 100' by using the mask layer 110', the process may be referred to as a selective area growth (SAG) process. Also, the SAG process may be referred to as a selective epitaxy growth (SEG) process. In a case where Group III-V material layers are selectively formed in the narrow groove H10 defined by the mask layer 110', defects are trapped at the sidewalls of the groove H10, and thus crystallinity of the Group III-V material layers may be improved as closer to the upper portion thereof. Therefore, in the present embodiment, the active layer 240 may have excellent crystallinity.

The buffer layer 210 may be formed of a Group III-V material containing at least one of a group consisting of In, Ga, and Al and at least one of a group consisting of As, P, and Sb. The Group III-V material of the buffer layer 210 may be a binary material, a ternary material, or a quaternary material. The binary material may include InP, InAs, InSb, GaAs, GaP, GaSb, AlP, AlAs, or AlSb, for example. The ternary material may include InAlAs, InGaP, or GaAsP, for example. The quaternary material may be InGaAsP or InGaAlAs, for example. The buffer layer 210 may be an n-type material layer. The buffer layer 210 may be a layer doped with an n-type impurity or may have characteristics similar to those of an n-doped layer. For example, the buffer layer 210 may be an n-type InP layer (n-InP layer). In a case where the buffer layer 210 is formed in the groove H10 having a small width, defects are trapped on the sidewalls of the groove H10 as the buffer layer 210 is formed, and thus the current blocking layer 220 formed on the buffer layer 210 may have less defects. The active layer 240 formed on the current blocking layer 220 may have little defects. As a result, the active layer 240 with excellent crystallinity may be obtained.

The current blocking layer 220 may include a material (Group III-V material) similar to the material of the buffer layer 210. More particularly, the current blocking layer 220 may be formed of a Group III-V material containing at least one of a group consisting of In, Ga, and Al and at least one of a group consisting of As, P, and Sb. The Group III-V material of the current blocking layer 220 may be a binary material, a ternary material, or a quaternary material. The binary material may include InP, InAs, InSb, GaAs, GaP, GaSb, AlP, AlAs, or AlSb, for example. The ternary material may include InAlAs, InGaP, or GaAsP, for example. The quaternary material may be InGaAsP or InGaAlAs, for example. At least a portion of the current blocking layer 220 may be a p-type material layer. In other words, at least a portion of the current blocking layer 220 may be doped with a p-type impurity. In the present embodiment, the current blocking layer 220 may be a p-type layer entirely doped with a p-type impurity. The p-type impurity may be Zn, Mg, or C, for example, and doping concentration of the p-type impurity may be from about $1 \times 10^{18}/cm^3$ to about $3 \times 10^{18}/cm^3$. For example, the current blocking layer 220 may be a p-type InP layer (p-InP layer). Because the current blocking layer 220 has a conductive type opposite to that of the buffer layer 210, a pn junction may be formed therebetween, and thus flow of a current from the upper portion above the current blocking layer 220 to the buffer layer 210 may be blocked (or suppressed). Furthermore, at least a portion (at least the bottom portion) of the current blocking layer 220 may function similarly as the buffer layer 210. In other words, at least a portion (at least the bottom portion) of the current blocking layer 220 may function to reduce defects, like the buffer layer 210.

The active layer 240 may include a Group III-V material (semiconductor). For example, the active layer 240 may include at least one of InGaAs, InP, InSb, and InAs as the Group III-V material. Furthermore, the active layer 240 may have a quantum well structure.

The barrier layer 230 may be further arranged between the active layer 240 and the current blocking layer 220. The barrier layer 230 may include a material having a greater energy band gap as compared to the active layer 240. Furthermore, the lowest energy level Ec of a conduction band of the barrier layer 230 may be higher than that of the active layer 240. Due to the barrier layer 230, the active layer 240 may have the quantum well structure as described above. The barrier layer 230 may include a Group III-V material. For example, the barrier layer 230 may be formed of a Group III-V material containing at least one of a group consisting of In, Ga, and Al and at least one of a group consisting of As, P, and Sb. For example, the barrier layer 230 may be formed of InAlAs, InP, or the like.

Next, an ohmic contact layer 250 may be formed on the active layer 240. The ohmic contact layer 250 may include a Group III-V material with low resistance. For example, the ohmic contact layer 250 may be formed of InGaAs heavily doped with an n-type impurity, e.g., n+InGaAs. However, the material constituting the ohmic contact layer 250 (e.g., the n+InGaAs) is merely an example, and the ohmic contact layer 250 may be formed of various materials. The ohmic contact layer 250 may be formed via an epitaxial growth. The ohmic contact layer 250 may be formed above the groove H10. In this case, the ohmic contact layer 250 may have a slightly greater width (the width in the x-axis direction) than the groove H10. In other words, the ohmic contact layer 250 may have a structure which slightly extends in two opposite x-axis directions on the active layer 240.

Figure 6F:
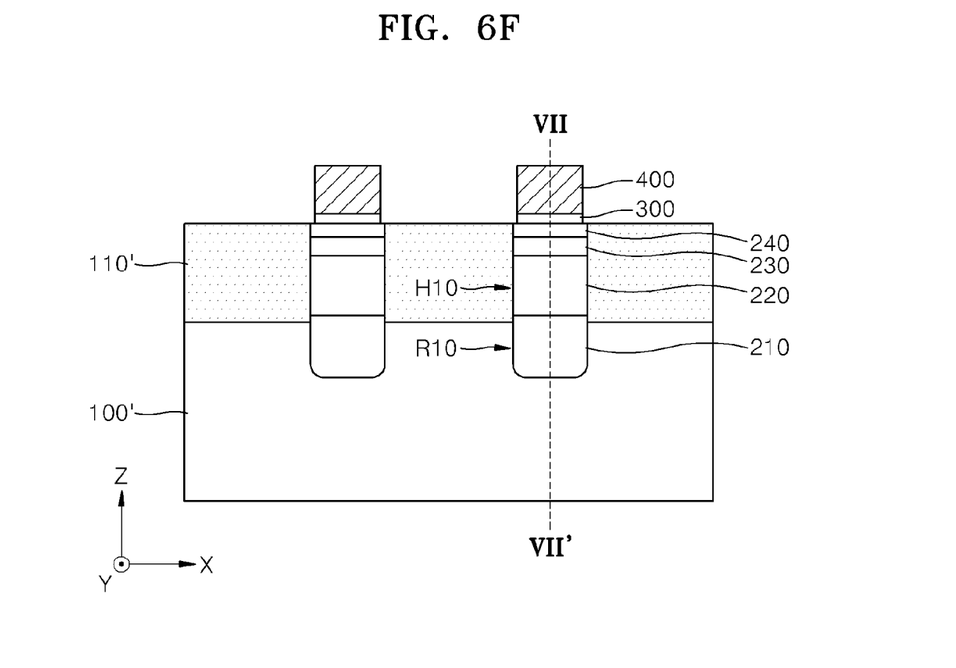

A portion of the active layer 240 may be exposed by removing a portion of the ohmic contact layer 250. At this point, a center portion of the ohmic contact layer 250 in the y-axis direction may be removed to expose the corresponding center portion of the active layer 240. Next, as shown in FIG. 6F, a gate insulation layer 300 and a gate electrode 400 may be formed on the exposed portion of the active layer 240. The gate insulation layer 300 may include at least one of $Al_2O_3$, $SiO_x$, $Si_xN_y$, $Sc_2O_3$, AlN, $Ga_2O_3$, $Gd_2O_3$, $Al_xGa_{2(1-x)}O_3$, MgO, and combinations thereof, for example. Even if not stated above, any of gate insulation layer materials used in general transistors may be applied to the gate insulation layer 300. The gate electrode 400 may be formed of various metals or conductive oxides.

Although not shown in FIG. 6F, unetched portions of the ohmic contact layer (250 of FIG. 6E) may remain at both sides of the gate electrode 400 in the y-axis direction, and a source electrode and a drain electrode may be formed thereon, respectively. The source electrode and the drain electrode are shown in FIG. 7, which is a sectional view taken along a line VII-VII' of FIG. 6F.

Figure 7:
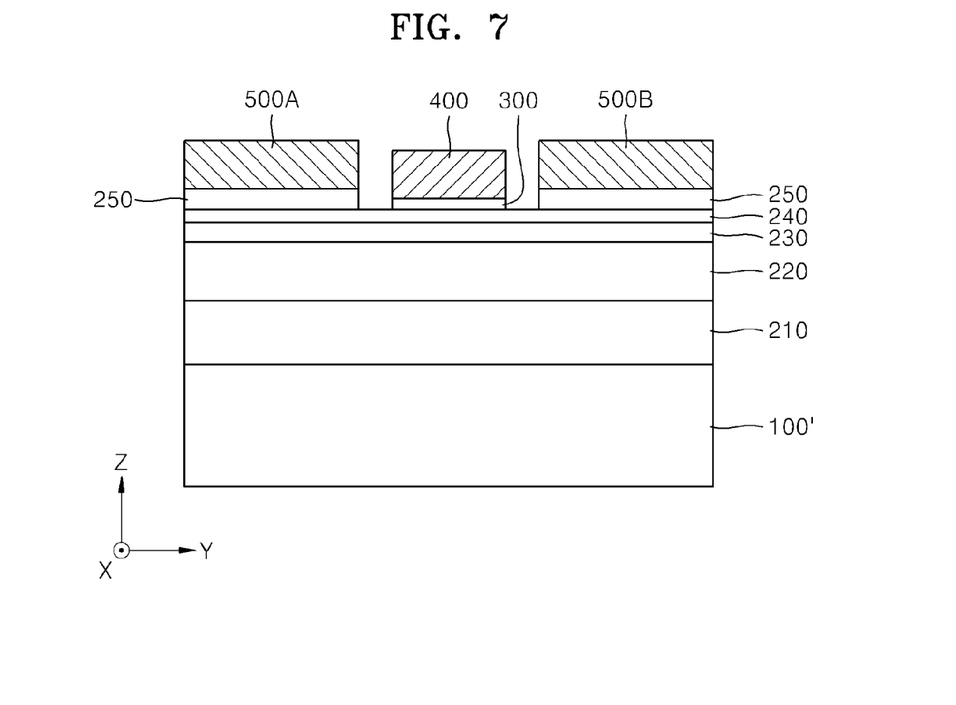
FIG. 7 is a sectional view taken along a line VII-VII' of FIG. 6F.

Referring to FIG. 7, a source electrode 500A and a drain electrode 500B may be formed on the active layer 240 at both sides of the gate electrode 400. The ohmic contact layer 250 may be arranged between the source electrode 500A and the active layer 240 and between the drain electrode 500B and the active layer 240. The source electrode 500A and the drain electrode 500B may be formed of any of various metals or conductive oxides and may be formed of either the same material as the gate electrode 400 or materials different from the material constituting the gate electrode 400. The source and drain electrodes 500A and 500B may be formed after the gate electrode 400 is formed, or vice versa. If the gate electrode 400 and the source and drain electrodes 500A and 500B are formed of a same material, the gate electrode 400 and the source and drain electrodes 500A and 500B may be formed at the same time. Furthermore, although not shown, a second barrier layer may be further formed between the active layer 240 and the gate insulation layer 300. A material constituting the second barrier layer may be same as or similar to the material constituting the barrier layer 230.

Figure 8A:
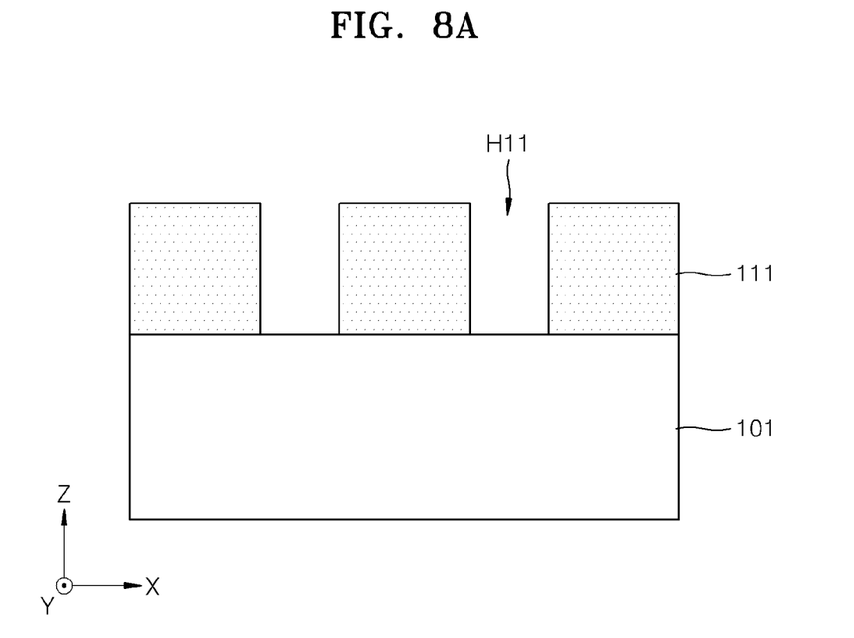
FIGS. 8A through 8C are sectional views showing a method of manufacturing a semiconductor device according to an example embodiment.
Figure 8B:
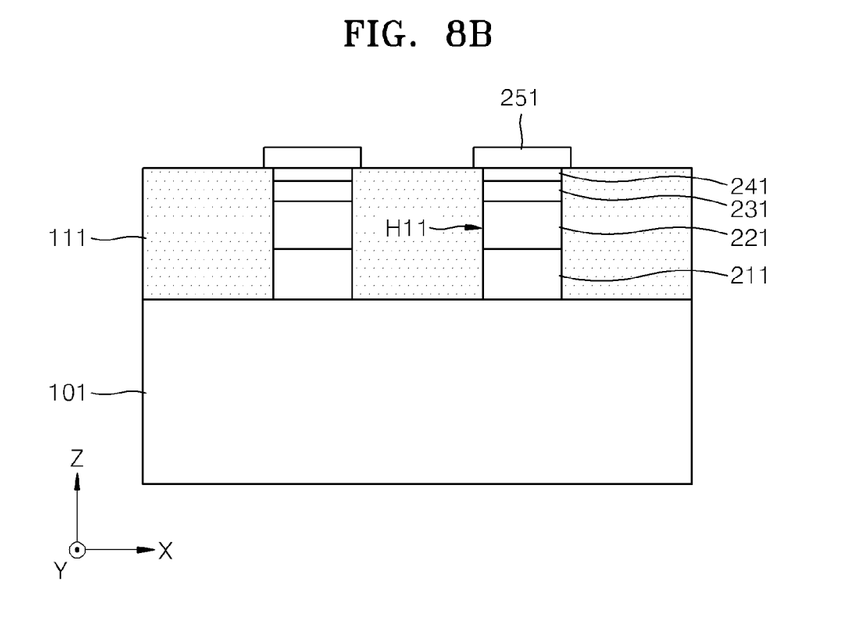
Figure 8C:
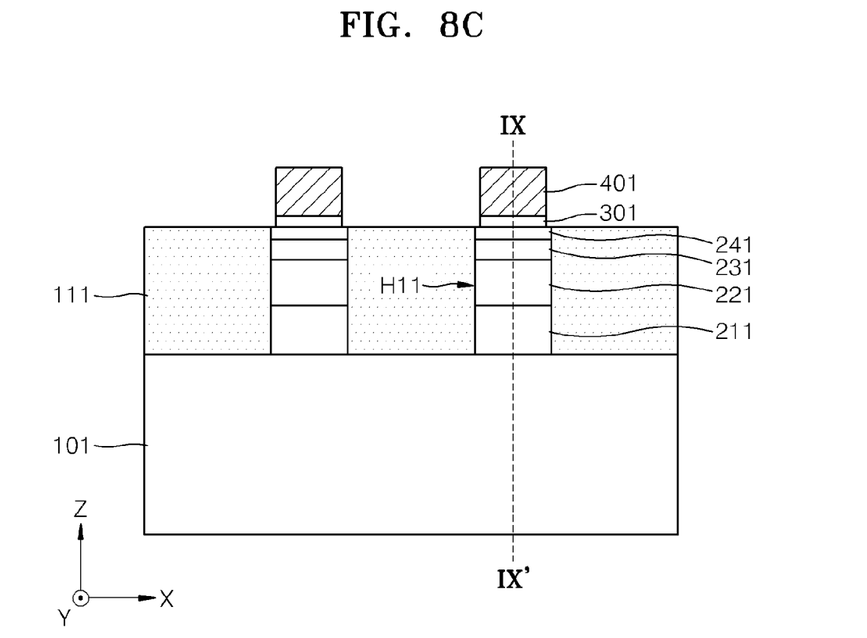

While a portion of the substrate 100 is etched and a device is fabricated on the recessed region R10 in the embodiment shown in FIGS. 6A through 6F, the substrate 100 may not be etched according to another example embodiment. An example thereof is shown in FIGS. 8A through 8C. Hereinafter, referring to FIGS. 8A through 8C, a method of manufacturing a semiconductor device according to another example embodiment invention will be described.

Referring to FIG. 8A, a mask layer 111 may be formed on a substrate 101. The substrate 101 may be same as the substrate 100 of FIG. 6A. In other words, the substrate 101 may be a Si substrate. Furthermore, the substrate 101 may be doped with a p-type impurity. The mask layer 111 may include at least one groove H11 exposing a portion of the substrate 101. A material and forming method of the mask layer 111 may be the same as or similar to those of the mask layer 110' of FIG. 6B.

Referring to FIG. 8B, a buffer layer 211, a current blocking layer 221, and an active layer 241 may be formed in the order stated on the portion of the substrate 101 exposed by the groove H11. A barrier layer 231 may be further formed between the current blocking layer 221 and the active layer 241. At least one of the buffer layer 211, the current blocking layer 221, the barrier layer 231, and the active layer 241 may include a Group III-V based material. All of the buffer layer 211, the current blocking layer 221, the barrier layer 231, and the active layer 241 may be formed of Group III-V based materials. Materials, properties, and formations of the buffer layer 211, the current blocking layer 221, the barrier layer 231, and the active layer 241 may be same as or similar to those described above with reference to FIG. 6E, respectively. Next, an ohmic contact layer 251 may be formed on the active layer 241. The ohmic contact layer 251 may include a Group III-V material with low resistance.

A portion of the active layer 241 may be exposed by removing a portion of the ohmic contact layer 251 (e.g., a center portion of the ohmic contact layer 251 in the y-axis direction). Next, as shown in FIG. 8C, a gate insulation layer 301 and a gate electrode 401 may be formed on the exposed portion of the active layer 241. Although not shown in FIG. 8C, unetched portions of the ohmic contact layer (251 of FIG. 8B) may remain at both sides of the gate electrode 401 in the y-axis direction, and a source electrode and a drain electrode may be formed thereon, respectively. The source electrode and the drain electrode are shown in FIG. 9, which is a sectional view taken along a line IX-IX' of FIG. 8C.

Figure 9:
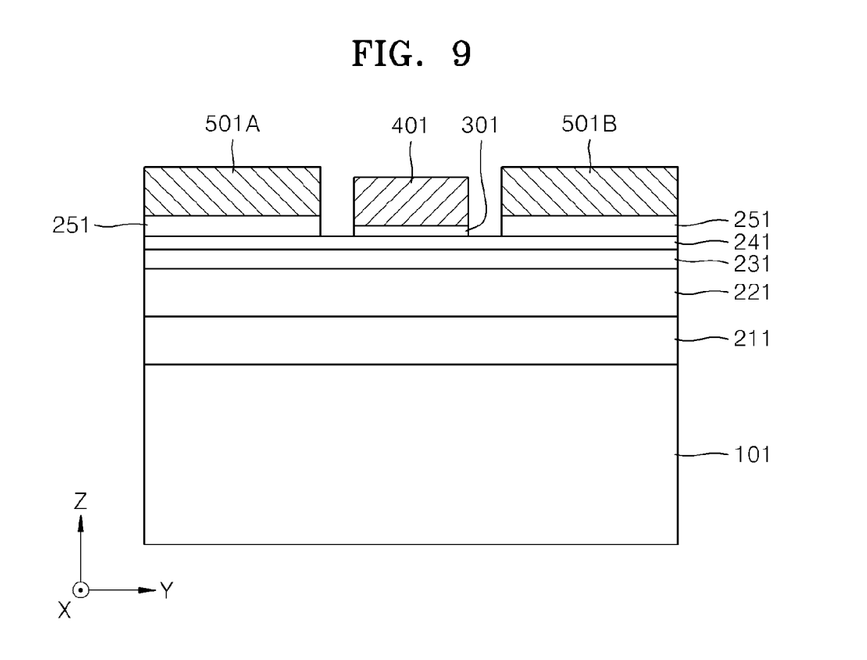
FIG. 9 is a sectional view taken along a line IX-IX' of FIG. 8C.

Referring to FIG. 9, a source electrode 501A and a drain electrode 501B may be formed on the active layer 241 at both sides of the gate electrode 401. The ohmic contact layer 251 may be arranged between the source electrode 501A and the active layer 241 and between the drain electrode 501B and the active layer 241. The structure shown in FIG. 9 is similar to that shown in FIG. 7.

While FIGS. 6A through 6F and FIGS. 8A through 8C show cases where the current blocking layers 220 and 221 have single-layer structures, the current blocking layers 220 and 221 may also have multi-layer structures like the current blocking layer CB10 of FIG. 3. The case where the current blocking layers 220 and 221 have the multi-layer structures is the same as described above with reference to FIG. 3, and thus detailed description thereof will be omitted.

Figure 10:
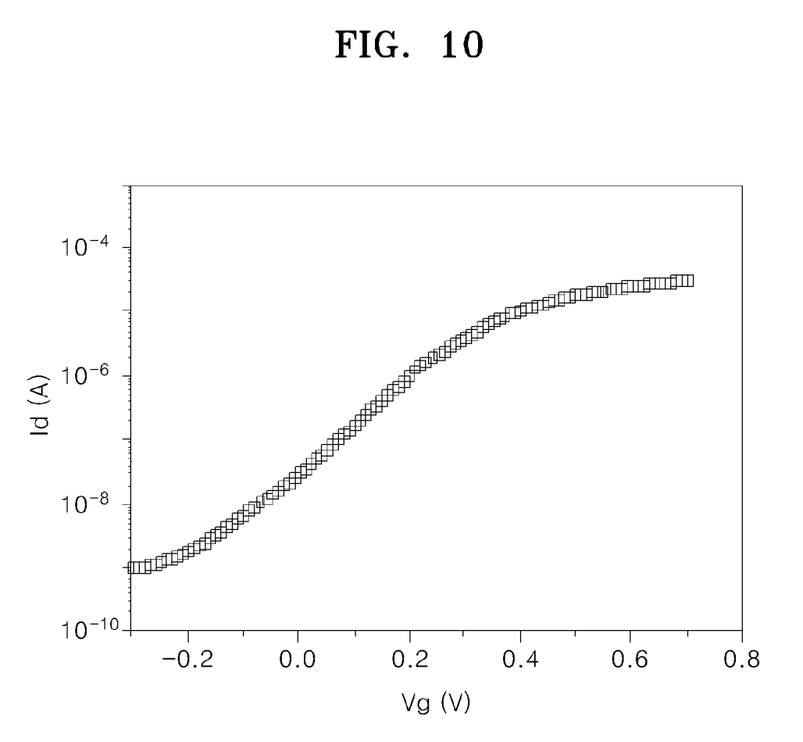
FIG. 10 is a graph showing gate voltage Vg-drain current Id characteristic of a semiconductor device (e.g., transistor) according to an example embodiment.

FIG. 10 is a graph showing gate voltage Vg-drain current Id characteristic of a semiconductor device (transistor) according to an example embodiment The semiconductor device (transistor) used to obtain the result shown in FIG. 1 has a structure as shown in FIGS. 1 and 2. For example, the substrate SUB1, the buffer layer BF1, the current blocking layer CB1, the barrier layer BR1, the active layer A1, and the ohmic contact layer CT1 are formed of p-Si, n-InP, p-InP, InAlAs, InGaAs, and n+InGaAs, respectively.

Referring to FIG. 10, the semiconductor device (transistor) according to an example embodiment shows relatively excellent switching characteristic. According to the graph, the ON/OFF current ratio of the transistor is about $10^4$. If the current blocking layer CB1 is not provided, due to current leakage from the active layer A1 to the substrate SUB1, switching characteristic as shown in FIG. 10 may not be obtained, and the gate voltage Vg-drain current Id graph may be almost horizontal. However, because the current blocking layer CB1 is provided in the example embodiments, current leakage may be effectively prevented (suppressed) and necessary switching characteristic for a transistor may be secured.

Although it is described above regarding cases where semiconductor devices according to example embodiments are used as transistors, semiconductor devices according to example embodiments may be applied otherwise. In other words, idea of the present inventive concepts may be applied to any of various devices in which Group III-V materials are applied onto monocrystalline substrates (e.g., Si substrates). For example, structures of semiconductor devices according to example embodiments may be applied to optical devices (light emitting devices), e.g., a light emitting diode (LED), a laser diode (LD), optoelectronic integrated circuits (OEICs) in which a LED and a LD are integrated together, and photovoltaic devices such as a solar battery (solar cell), a photodiode, and etc. In case of applying a semiconductor device according to an example embodiment to an optical device, an active layer may be used as a light emitting layer or a photoactive layer, and a number and an arrangement of electrodes arranged on the active layer may differ from those described above. Furthermore, a semiconductor layer may be further arranged between the active layer and the electrode. Furthermore, configuration of semiconductor devices according to example embodiments may be modified in various ways.

While the inventive concepts have been particularly shown and described with reference to example embodiments thereof, it will be understood by those skilled in the art that various changes in form and details may be made therein without departing from the spirit and scope of the inventive concepts as defined by the appended claims. The example embodiments should be considered in descriptive sense only and not for purposes of limitation. For example, one of ordinary skill in the art will understand that various modifications may be made in structures of the semiconductor devices shown in FIGS. 1 through 5. In detail, various compound semiconductor materials other than Group III-V material may be used to form the current blocking layer and the active layer, and various materials other than silicon may be applied to the substrate. Furthermore, the barrier layer may be not used in the devices. Also, various modifications may also be made in the method shown in FIGS. 6A through 6F and the method shown in FIGS. 8A through 8C. In addition, one of ordinary skill in the art will understand that idea of the present inventive concepts may be applied to semiconductor devices other than transistors. Therefore, the scope of the inventive concepts is defined not only by the detailed description of the invention, but also by the appended claims, and all differences within the scope will be construed as being included in the present inventive concepts.

What is claimed is:

1. A semiconductor device comprising:
   a substrate;
   a multi-layer structure disposed on a portion of the substrate; and
   at least one electrode disposed on the multi-layer structure,
   wherein the multi-layer structure includes,
      an active layer containing a Group III-V material,
      a current blocking layer between the substrate and the active layer, and
      a barrier layer between the current blocking layer and the active layer, an energy band gap of the barrier layer being larger than that of the active layer.

2. The semiconductor device of claim 1, wherein the substrate is a silicon substrate.

3. The semiconductor device of claim 1, wherein the multi-layer structure further includes a buffer layer disposed between the substrate and the current blocking layer.

4. The semiconductor device of claim 3, wherein the buffer layer comprises a Group III-V material.

5. The semiconductor device of claim 3, wherein the buffer layer is an n-type material layer.

6. The semiconductor device of claim 1, wherein the active layer has a quantum well structure.

7. The semiconductor device of claim 1, wherein the active layer comprises at least one of InGaAs, InP, InSb, and InAs.

8. The semiconductor device of claim 1, wherein the current blocking layer comprises a Group III-V material.

9. The semiconductor device of claim 8, wherein the Group III-V material of the current blocking layer is a binary material, a ternary material, or a quaternary material which comprise at least one of a group consisting of In, Ga, and Al and at least one of a group consisting of As, P, and Sb.

10. The semiconductor device of claim 1, wherein at least a portion of the current blocking layer is doped with a p-type impurity.

11. The semiconductor device of claim 1, wherein the current blocking layer has a single-layer structure or a multi-layer structure, the current blocking layer comprising a p-type material layer.

12. The semiconductor device of claim 11, wherein the current blocking layer has the multi-layer structure, and the current blocking layer comprises a p-type first layer, an n-type second layer, and a p-type third layer, the n-type second layer and the p-type third layer alternately stacked on the p-type first layer for one or more times.

13. The semiconductor device of claim 1, further comprising:
   a mask layer disposed on the substrate, the mask layer including an opening exposing the portion of the substrate, and
   the multi-layer structure disposed on the portion of the substrate exposed by the opening.

14. The semiconductor device of claim 13, wherein the substrate includes a recessed region, the recessed region formed in the substrate and exposed by the opening, and
   the multi-layer structure is disposed at least partially in the recessed region.

15. The semiconductor device of claim 1, wherein the semiconductor device is a transistor, and
   the active layer is a channel layer.

16. The semiconductor device of claim 15, wherein the at least one electrode comprises:
   a source electrode disposed on a first region of the active layer;
   a drain electrode disposed on a second region of the active layer; and
   a gate electrode disposed on a portion of the active layer between the source electrode and the drain electrode.

17. A transistor comprising:
   a silicon substrate;
   a mask layer arranged on the silicon substrate, the mask layer including an opening exposing a portion of the silicon substrate;
   a multi-layer structure on the portion of the substrate exposed by the opening, the multi-layer structure including a buffer layer, a current blocking layer, and a channel layer that are arranged in the order stated;
   a source electrode electrically connected to a first region of the channel layer;
   a drain electrode electrically connected to a second region of the channel layer; and
   a gate electrode arranged on a third region of the channel layer.

18. The transistor of claim 17, wherein the silicon substrate includes a recessed region, the recessed region formed in the substrate and exposed by the opening, and
   at least one of the buffer layer, the current blocking layer, and the channel layer is at least partially disposed in the recessed region.

19. The transistor of claim 17, wherein at least one of the buffer layer, the current blocking layer, and the channel layer comprises a Group III-V material.

20. The transistor of claim 17, wherein the buffer layer is an n-type material layer.

21. The transistor of claim 17, wherein the current blocking layer has a single-layer structure or a multi-layer structure, the current blocking layer comprising a p-type material layer.

22. The transistor of claim 17, wherein the current blocking layer comprises a Group III-V material, the Group III-V material being a binary material, a ternary material, or a quaternary material which comprise at least one of a group consisting of In, Ga, and Al and at least one of a group consisting of As, P, and Sb.

23. The transistor of claim 17, further comprising:
   a barrier layer arranged between the current blocking layer and the channel layer,
   wherein an energy band gap of the barrier layer is larger than that of the channel layer.

24. The transistor of claim 23, wherein
   the buffer layer comprises an n-InP layer,
   the current blocking layer comprises a p-InP layer,
   the barrier layer comprises an InAlAs layer, and
   the channel layer comprises an InGaAs layer.

25. A method of manufacturing a semiconductor device, the method comprising:
   forming a mask layer on a substrate, the mask layer including an opening exposing a portion of the substrate;
   forming, after forming the mask layer, a multi-layer structure on the portion of the substrate; and forming at least one electrode on the multi-layer structure, wherein the forming of the multi-layer structure includes, forming a current blocking layer on the portion of the substrate; and forming an active layer containing a Group III-V material on the current blocking layer.

26. The method of claim 25, wherein the substrate is a silicon substrate.

27. The method of claim 25, wherein the multi-layer structure is formed via a selective area growth (SAG) method.

28. The method of claim 25, further comprising:

after the forming a mask layer, forming a recessed region by etching the portion of the substrate exposed by the opening, wherein the multi-layer structure is formed at least partially in the recessed region.

29. The method of claim 25, wherein the forming a multi-layer structure further comprises:

forming a buffer layer between the substrate and the current blocking layer.

30. The method of claim 29, wherein the buffer layer comprises a Group III-V material doped with an n-type impurity.

31. The method of claim 25, wherein the forming a multi-layer structure further comprises:

forming a barrier layer between the current blocking layer and the active layer, wherein an energy band gap of the barrier layer is larger than that of the channel layer.

32. The method of claim 25, wherein the active layer comprises at least one of InGaAs, InP, InSb, and InAs.

33. The method of claim 25, wherein the current blocking layer comprises a Group III-V material.

34. The method of claim 33, wherein the Group III-V material of the current blocking layer is a binary material, a ternary material, or a quaternary material which comprise at least one of a group consisting of In, Ga, and Al and at least one of a group consisting of As, P, and Sb.

35. The method of claim 25, wherein the current blocking layer has a single-layer structure or a multi-layer structure, the current blocking layer comprising a p-type material layer.

36. The method of claim 25, wherein the forming at least one electrode comprises:

forming a source electrode on a first region of the active layer;

forming a drain electrode on a second region of the active layer; and forming a gate electrode on a portion of the active layer between the source electrode and the drain electrode.

* * * * *